(12) United States Patent
Lin et al.

(10) Patent No.: US 12,078,190 B2
(45) Date of Patent: Sep. 3, 2024

(54) LIQUID-COOLING HEAT DISSIPATION DEVICE

(71) Applicant: COOLER MASTER CO., LTD., New Taipei (TW)

(72) Inventors: Tsung-Wei Lin, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 770 days.

(21) Appl. No.: 16/853,701

(22) Filed: Apr. 20, 2020

(65) Prior Publication Data
US 2021/0156399 A1 May 27, 2021

(30) Foreign Application Priority Data
Nov. 27, 2019 (TW) ................. 108215769

(51) Int. Cl.
*F04D 29/58* (2006.01)
*H05K 7/20* (2006.01)
(52) U.S. Cl.
CPC ..... *F04D 29/5873* (2013.01); *H05K 7/20254* (2013.01); *H05K 7/20272* (2013.01)

(58) Field of Classification Search
CPC ............ F04D 29/5873; H05K 7/20272; H05K 7/20254
See application file for complete search history.

(56) References Cited

U.S. PATENT DOCUMENTS

| 10,015,909 | B1 * | 7/2018 | Han | G06F 1/20 |
| 2011/0217193 | A1 * | 9/2011 | Wang | F04D 13/08 |
| | | | | 417/423.3 |
| 2016/0216048 | A1 * | 7/2016 | Tsai | F28F 3/12 |
| 2016/0338223 | A1 * | 11/2016 | Tsai | F28F 3/12 |
| 2018/0098460 | A1 * | 4/2018 | Ko | H01L 23/473 |
| 2019/0239388 | A1 * | 8/2019 | Tsai | H05K 7/20263 |
| 2020/0173728 | A1 * | 6/2020 | Pan | G06F 1/20 |
| 2022/0291727 | A1 * | 9/2022 | Tsai | H01L 23/473 |

FOREIGN PATENT DOCUMENTS

EP     3730889 A1 * 10/2020 ............... F28D 1/04

* cited by examiner

*Primary Examiner* — Gordon A Jones
(74) *Attorney, Agent, or Firm* — Maschoff Brennan

(57) ABSTRACT

A liquid-cooling heat dissipation device including a base and two pumps. The base has a first inlet and a first outlet. The two pumps are disposed on the base and connected to the first inlet and the first outlet in a parallel arrangement.

20 Claims, 4 Drawing Sheets

LIQUID-COOLING HEAT DISSIPATION DEVICE

CROSS-REFERENCE TO RELATED APPLICATIONS

This non-provisional application claims priority under 35 U.S.C. § 119(a) on Patent Application No(s). 108215769 filed in Taiwan, R.O.C. on November 27th, the entire contents of which are hereby incorporated by reference.

TECHNICAL FIELD

The disclosure relates to a heat dissipation device, more particularly to a liquid-cooling heat dissipation device.

BACKGROUND

As the processing speed and performance of an electronic device such as central processing unit (CPU) progress, a large amount of heat is generated during operation. Therefore, cooling system is indispensable for the modern electronic device to dissipate such heat as soon as possible. There are two types of cooling systems: liquid cooling and air cooling. In comparison to air cooling, liquid cooling is more effective in transporting heat away from a source because liquid materials are better conductors of heat. Therefore, to cool the same amount of heat as liquid cooling, air cooling needs to have its fan running faster which generates more noise and typically blows hot air back onto other components in the system. For the above reasons, liquid cooling is more efficient in maintaining a high-end computer to operate at a consistently cool temperature.

For a liquid cooling device, a water block is put on the parts required to be cooled, and a water pump, a radiator, and a reservoir are connected to the water block with various tubing. The water pump can pump liquid coolant from the reservoir into the water pump to absorb the heat, and then the heated coolant is pumped into the radiator where it is cooled. The liquid coolant is then pumped out again to the water block, and the cycle begins anew. The current liquid cooling devices still have some issues needed to be solved. For example, the appearance of the water block is too monotonous to be attractive to consumers, and the ability of the water block to drive the working fluid is limited due to the area of copper block.

SUMMARY

The disclosure provides a liquid-cooling heat dissipation device having a unique appearance and an improved ability in driving the working fluid while having a limited area of copper piece.

One embodiment of the disclosure provides a liquid-cooling heat dissipation device including a base and two pumps. The base has a first inlet and a first outlet. The two pumps are disposed on the base and connected to the first inlet and the first outlet in a parallel arrangement.

Another embodiment of the disclosure provides a liquid cooling heat dissipation device including a base, two tank parts and two impellers. The base has a first inlet and a first outlet. The two tank parts are disposed on the base. Both of the two tank parts are connected to the first inlet and the first outlet so that the two tank parts are in a parallel arrangement. The two impellers are respectively disposed in the two tank parts. Each of the two tank parts has an exposed surface, the exposed surfaces of the two tank parts are light-permeable, and the two impellers are respectively exposed via the two exposed surfaces of the two tank parts.

According to the liquid-cooling heat dissipation device discussed above, with two pumps, the liquid-cooling heat dissipation device can provide more working fluid in higher speed to effectively dissipate the heat generated by the heat source.

Furthermore, since the two tank parts are inclined and the distance between the two exposed surfaces decreases from sides of the exposed surfaces located close to the thermal contact surface to sides of the exposed surfaces located away from the thermal contact surface, or axes of the two impellers are not parallel to each other and have an obtuse angle, less space near the heat source is occupied.

In addition, since the exposed surfaces are light-permeable, face away from the thermal contact surface, and have obtuse angle, the operation of the tank part can be seen, and the inclined exposed surfaces show a unique and unconventional appearance.

Above summary and following detailed descriptions are used to demonstrate and illustrate the principle of the disclosure and provide a further explanation of the claims.

DETAILED DESCRIPTION

Figure 1:
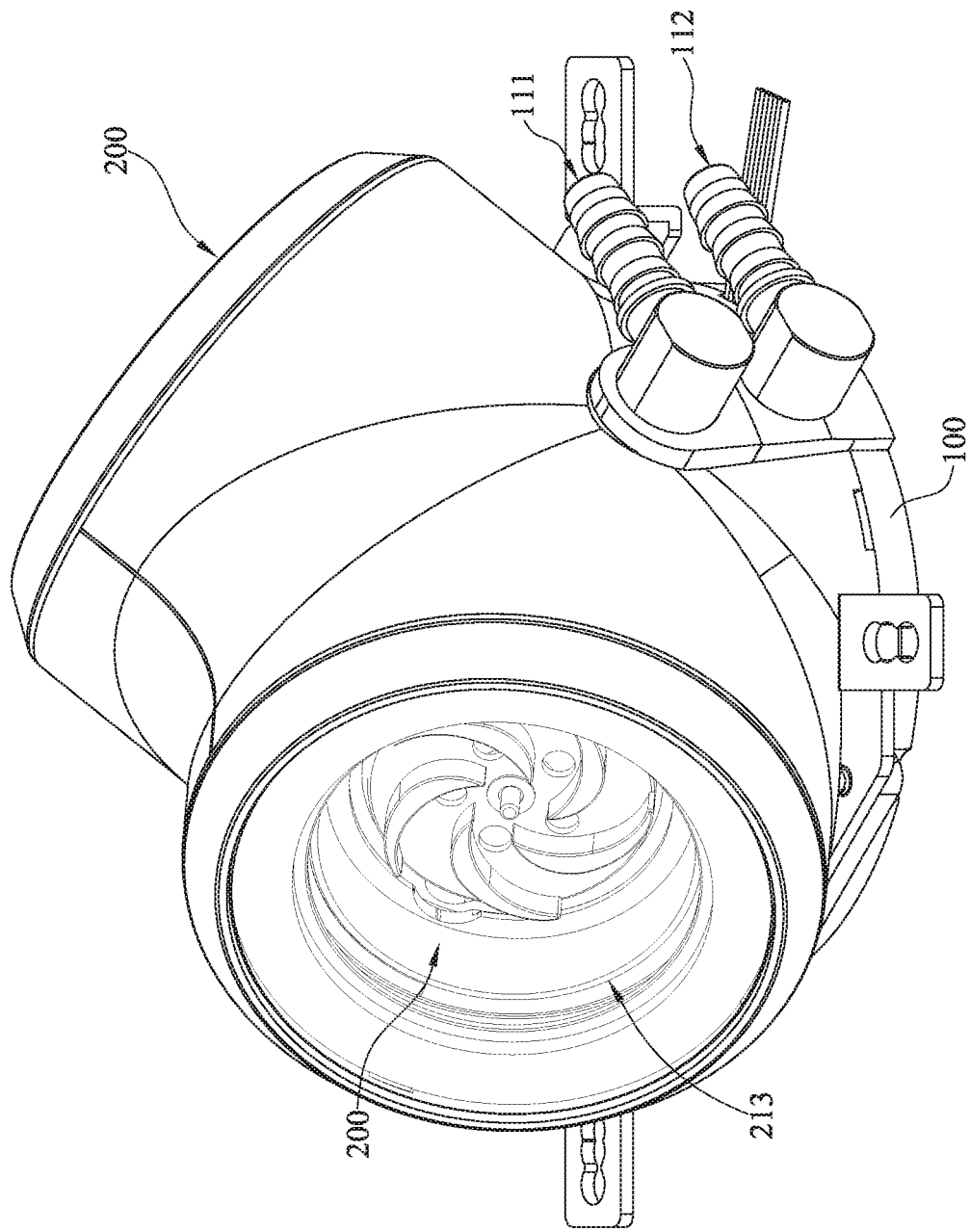
FIG. 1 is a perspective view of a liquid-cooling heat dissipation device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Firstly, please refer to FIG. 1, a perspective view of a liquid-cooling heat dissipation device 10 according to one embodiment of the disclosure is provided.

The liquid-cooling heat dissipation device 10 is configured to be in thermal contact with a heat source (not shown) so as to cool the heat source. The heat source may be a central processing unit, a southbridge chip, a northbridge chip or a graphic processing unit, but the disclosure is not limited thereto. In this embodiment, the liquid-cooling heat dissipation device 10 includes a base 100 and two pumps 200.

Figure 2:
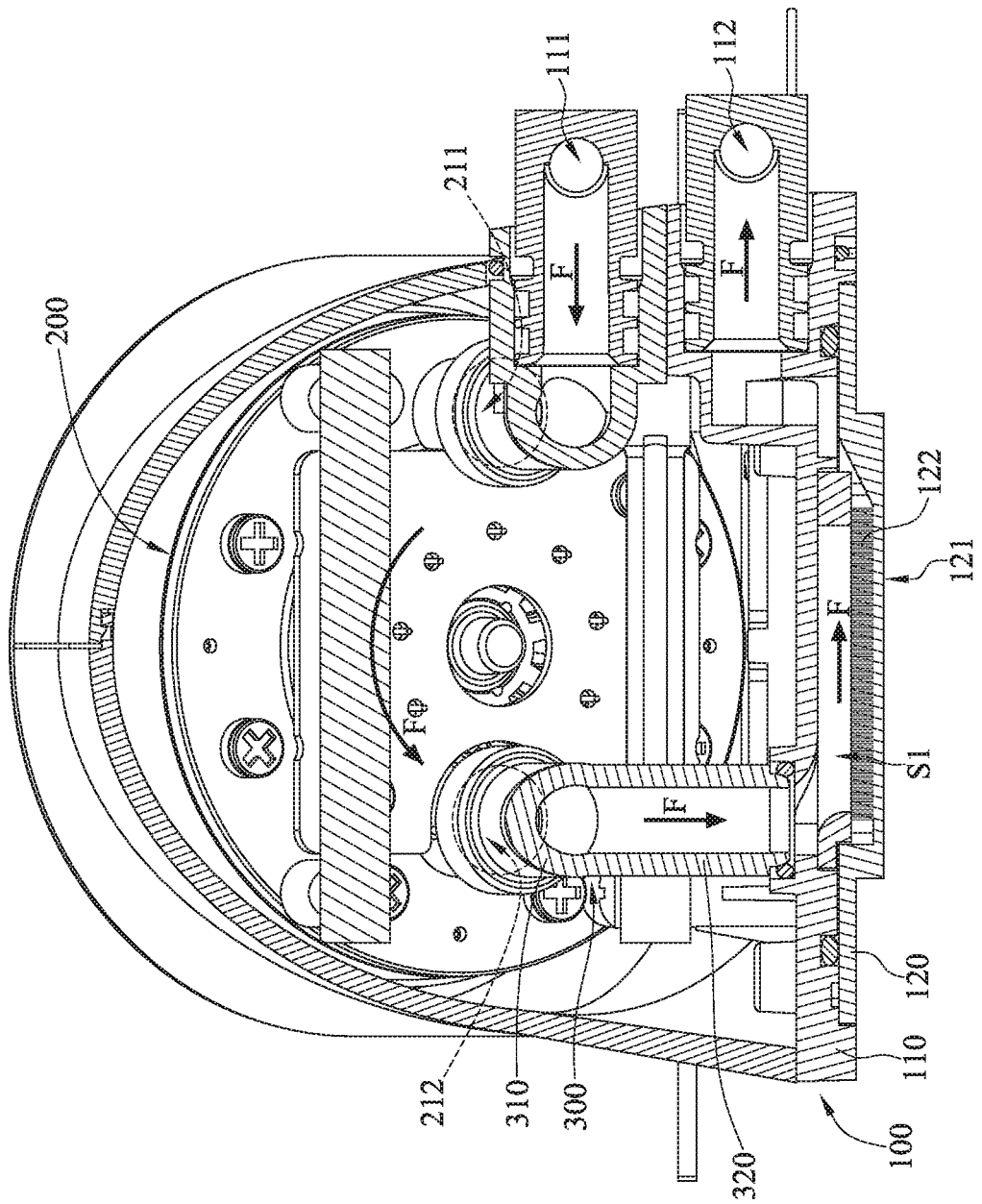
FIG. 2 is a cross-sectional view of the liquid-cooling heat dissipation device in FIG. 1.
Figure 3:
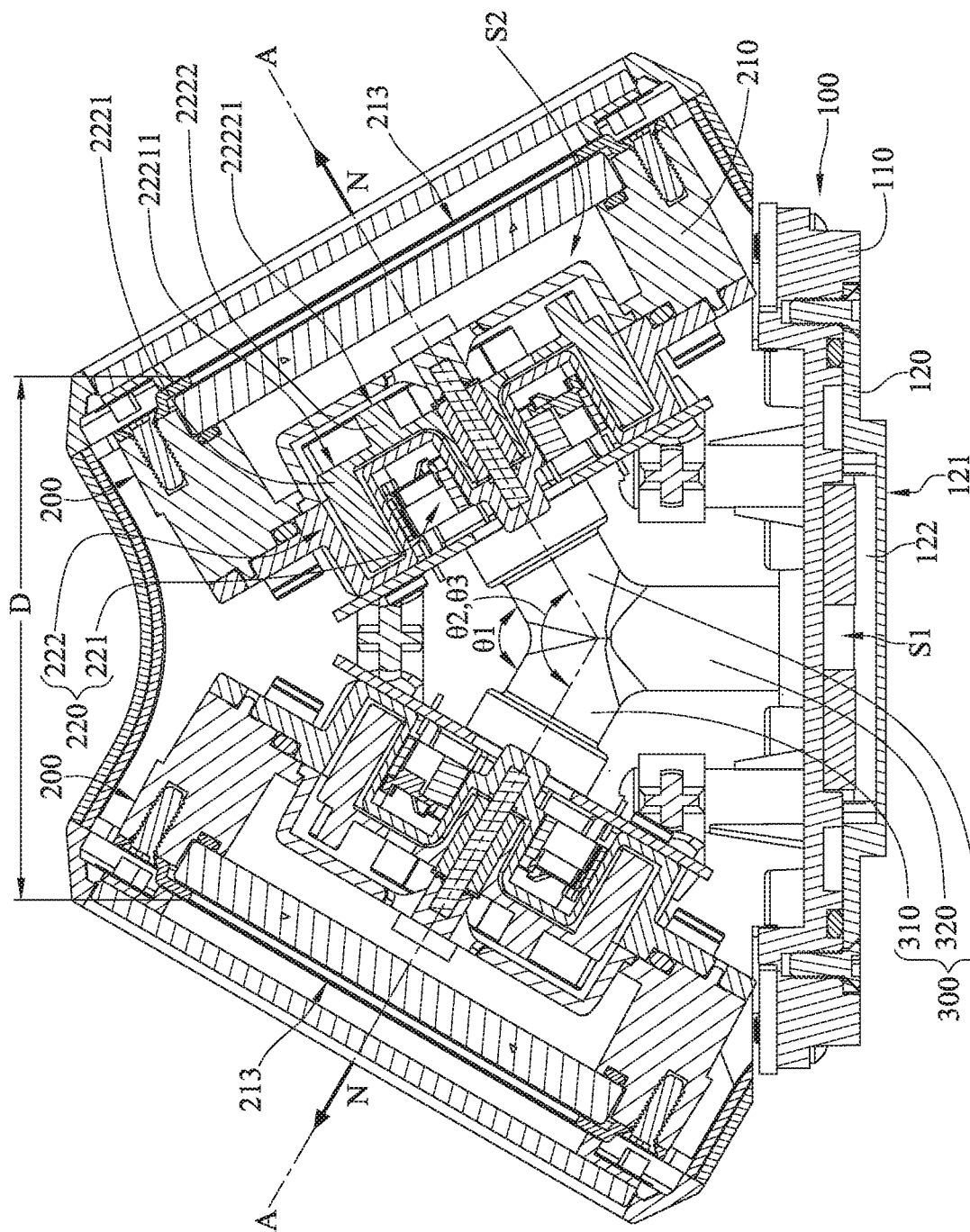
FIG. 3 is another cross-sectional view of the liquid-cooling heat dissipation device in FIG. 1.

Then, please further refer to FIG. 2 and FIG. 3, FIG. 2 is a cross-sectional view of the liquid-cooling heat dissipation device 10 in FIG. 1, and FIG. 3 is another cross-sectional view of the liquid-cooling heat dissipation device 10 in FIG. 1.

The base 100 includes a body part 110 and a thermally conductive part 120. The body part 110 has a first inlet 111 and a first outlet 112. The thermally conductive part 120 is disposed on the bottom of the body part 110 and is, for example, a piece of copper. The thermally conductive part 120 and the body part 110 together form a heat dissipation space S1 therebetween. The heat dissipation space S1 is connected to the first outlet 112 configured to discharge the working fluid in the heat dissipation space S1. The thermally conductive part 120 has a thermal contact surface 121 located away from the body part 110. The thermal contact surface 121 is configured to be in thermal contact with the heat source so as to transfer the heat generated by the heat source to the working fluid in the heat dissipation space S1.

In this embodiment, the thermally conductive part 120 further has a plurality of heat dissipation fins 122 located away from the thermal contact surface 121. As shown, the heat dissipation fins 122 are located in the heat dissipation space S1. The heat dissipation fins 122 improve the heat transfer from the heat source to the working fluid contained in the heat dissipation space S1.

The pumps 200 are disposed on the body part 110 of the base 100. The pumps 200 each include a tank part 210 and a liquid driving assembly 220. The tank part 210 has a chamber S2, a second inlet 211, and a second outlet 212, where the second inlet 211 and the second outlet 212 are connected to the chamber S2. The second inlets 211 of the pumps 200 are both connected to the first inlet 111 of the base 100, and the second outlets 212 of the pumps 200 are both connected to the first outlet 112 via the heat dissipation space S1. As such, the pumps 200 are connected in a parallel manner. With such an arrangement, as indicated by the arrows F shown in FIG. 2, the working fluid can flow into the body part 110 via the first inlet 111, then flow into the chambers S2 of the tank parts 210 via the second inlets 211, then flow into the heat dissipation space S1 via the second outlets 212, and then flow out of the heat dissipation space S1 from the first outlet 112.

In addition, the liquid-cooling heat dissipation device 10 further includes a pipe 300. As shown, the pipe 300 is, for example, a three-way pipe. The pipe 300 includes two branch parts 310 and a convergence part 320 connected to the branch parts 310, where the branch parts 310 and the convergence part 320 together form a Y-shape, and the angle θ1 between the branch parts 310 is an obtuse angle. The second outlets 212 are respectively connected to the branch parts 310 of the pipe 300. The convergence part 320 of the pipe 300 is connected to the heat dissipation space Si of the base 100 where the first outlet 112 is connected.

In this embodiment, the angle θ1 between the branch parts 310 can assist in reducing turbulent flow. Also, the single convergence part 320 only occupies a very limited space, which is described in later paragraphs.

Note that the angle θ1 between the branch parts 310 is not restricted to be obtuse. In other embodiments, the angle between the branch parts may be acute or right. In addition, the tank parts 210 are not restricted to be connected to the base 100 via the pipe 300; in other embodiments, the tank parts may be connected to the base via another flexible pipe.

Additionally, each tank part 210 has an exposed surface 213. The exposed surface 213 is light-permeable and the part of the tank part 210 forming the observed surface 213 may be made of glass or light-permeable acrylic. Also, the exposed surfaces 213 are not parallel to each other. In detail, the normal line N of one of the exposed surfaces 213 is at an obtuse angle θ2 to that of the other exposed surface 213. This arrangement allows viewers to peek the working fluid in the tanks 210 or the operation of the tank parts 210. Moreover, such inclined arrangement also allows the working fluid to concentrate on a side of the tank parts 210 located close to exposed surfaces 213, and thus areas of the driving assemblies 220 that is in contact with the working fluid are increased so that the working fluid can be effectively pumped even when only a little working fluid is stored in the chambers S2 of the tank parts 210.

Note that the exposed surfaces are not restricted to be non-parallel to each other. In other embodiments, the exposed surfaces may be parallel to each other and both perpendicular to the thermal contact surface and such arrangement of exposed surfaces also allows viewers to observe the working fluid in the tank parts.

Figure 4:
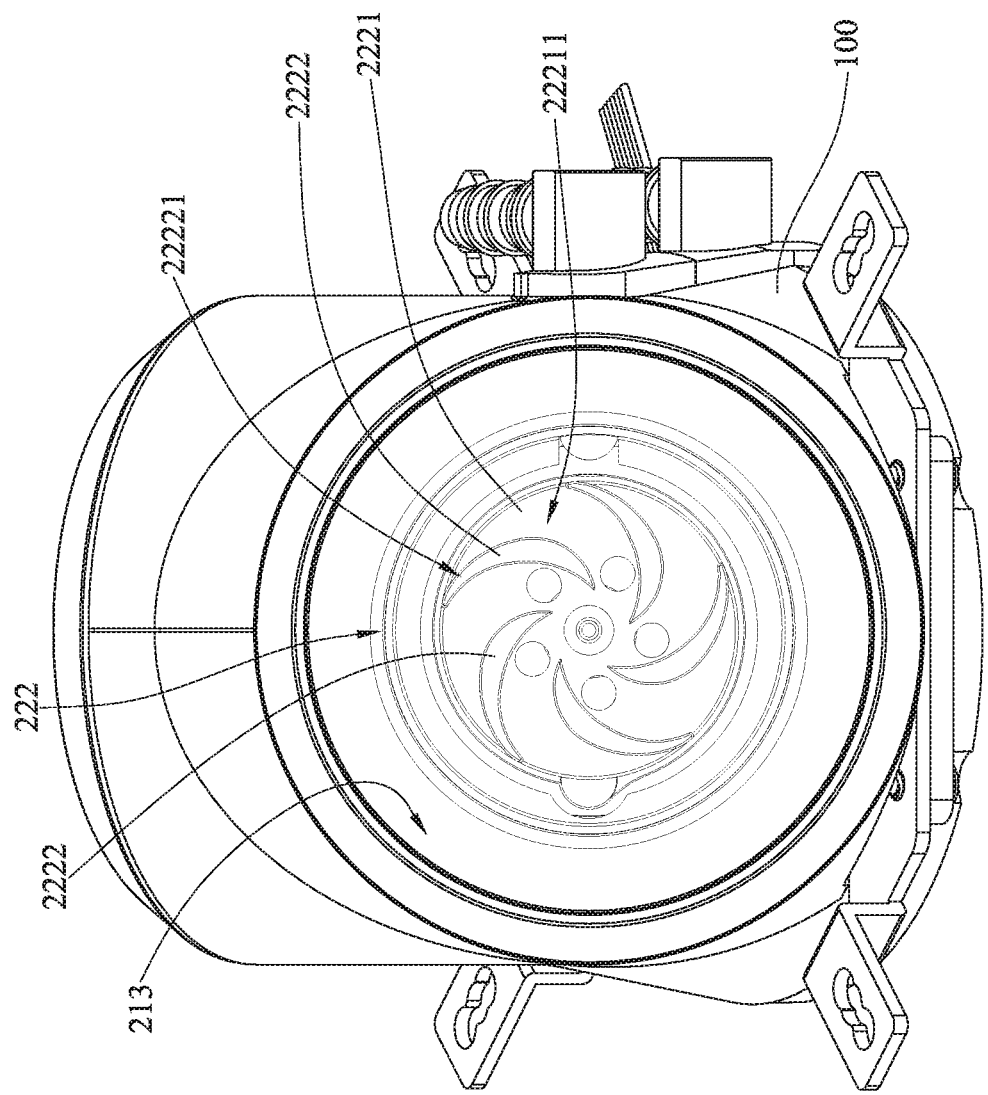
FIG. 4 is a planar view of the liquid-cooling heat dissipation device in FIG. 1.

Please refer to FIG. 3 and further refer to FIG. 4, where FIG. 4 is a planar view of the liquid-cooling heat dissipation device 10 in FIG. 1. In this embodiment, the liquid driving assembly 220 is disposed in the tank part 210 and includes a power source 221 and an impeller 222. The power source 221 is able to drive the impeller 222 to rotate relative to the tank part 210 so as to force the working fluid to flow into the chamber S2 through the second inlet 211 and then to flow out of the chamber S2 from the second outlet 212. The impeller 222 includes a hub 2221 and a plurality of blades 2222. The hub 2221 is rotatably disposed in the tank part 210 and has a first exposed surface 22211 facing the exposed surface 213. The blades 2222 protrude from the first exposed surface 22211 of the hub 2221 and each have a second exposed surface 22221 facing toward the exposed surface 213. The first exposed surface 22211 and the second exposed surfaces 22221 of the impeller 222 are exposed from the exposed surface 213, and thus viewers can observe the movement of the impeller 222 from the exposed surface 213 to understand the current state of the liquid-cooling heat dissipation device 10.

In this embodiment, the second exposed surfaces 22221 and the first exposed surface 22211 may be in different colors so as to provide different visual effects. As such, the rotation of the impeller 222 can mix the colors of the second exposed surfaces 22221 and the first exposed surface 22211 to deliver a color-mixing effect. In one embodiment, the first exposed surface 22211 and the second exposed surface 22221 may be in contrast colors, such as white and black.

However, the visual effect of the first exposed surface 22211 and the second exposed surfaces 22221 are not limited to be different. In other embodiments, the first exposed surface and the second exposed surfaces may be in the same color, such as black or white.

Comparing to the liquid-cooling heat dissipation device that only has a single pump, the liquid-cooling heat dissipation device 10 having double pumps 200 can almost double the flow rate of the working fluid and increase the flow speed of the working fluid, such that the liquid-cooling heat dissipation device 10 can provide more working fluid in higher speed to effectively dissipate the heat generated by the heat source.

In addition, in the typical liquid-cooling heat dissipation device that has a single pump, the pump is placed on the heat source in flat manner and thus occupies most of the space near the heat source. In contrast, in the disclosure, the liquid-cooling heat dissipation device 10 contains two pumps 200, but the tank parts 210 of the pumps 200 are arranged in inclined manner with respect to the base 100 and therefore can be arranged on a single heat source. Specifically, a distance D between the two exposed surfaces 213 decreases from sides of the exposed surfaces 213 located close to the thermal contact surface 121 to sides of the exposed surfaces 213 located away from the thermal contact surface 121, and axes A of the two impellers 222 have an obtuse angle θ3, such that less space near the heat source is occupied. That is, the pumps have no need to be placed in flat manner to be placed on a limited surface of a single heat source.

However, in other embodiments, the distance between the two exposed surfaces may decrease from sides of the exposed surfaces located close to the thermal contact surface to opposite sides thereof or the axes of the two impellers may be parallel in order to match the size of the heat source or that of the available space nearby. Even, in the embodiments where axes of the two impellers have an obtuse angle, the two exposed surfaces and the thermal contact surface may be coplanar, or in the embodiments where two exposed surfaces have an obtuse angle, axes of the two impellers may be parallel to a normal line of the thermal contact surface.

Further, in this embodiment, the liquid-cooling heat dissipation device 10 includes two pumps 200, and the power sources 221 and the impellers 222 are disposed in the tank part 210, but the disclosure is not limited thereto. In other embodiments where the observed surface of the tank part is light-permeable, the power source may not be disposed in the tank part. That is, in the embodiments where the observed surface of the tank part is light-permeable, the liquid-cooling heat dissipation device may include the two tank parts and may not include the power source. That is, the exposed surface 213 of the tank part 210 is not restricted to be light-permeable and the liquid-cooling heat dissipation device 10 is not restricted to include the power sources 221, in other embodiments, the exposed surface of the tank part may not be light-impermeable, and the liquid-cooling heat dissipation device may not include any power source According to the liquid-cooling heat dissipation device discussed above, with two pumps, the liquid-cooling heat dissipation device can provide more working fluid in higher speed to effectively dissipate the heat generated by the heat source.

Furthermore, since the two tank parts are inclined and the distance between the two exposed surfaces decreases from sides of the exposed surfaces located close to the thermal contact surface to sides of the exposed surfaces located away from the thermal contact surface, or axes of the two impellers are not parallel to each other and have an obtuse angle, less space near the heat source is occupied.

In addition, since the exposed surfaces are light-permeable, face away from the thermal contact surface, and have obtuse angle, the operation of the tank part can be seen, and the inclined exposed surfaces show a unique and unconventional appearance.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid-cooling heat dissipation device, comprising:
a base, having a first inlet and a first outlet; and
two pumps, disposed on the base and connected to the first inlet and the first outlet in a parallel arrangement;
wherein each of the two pumps comprises:
a tank part, having an exposed surface, and the exposed surface of the tank part being light-permeable; and
a liquid driving assembly, disposed in the tank part, the liquid driving assembly comprising a power source and an impeller, the power source configured to drive the impeller to rotate relative to the tank part, and the impeller exposed via the exposed surface of the tank part;
wherein said each of the impellers comprises a hub and a plurality of blades, in said each of the impellers, the hub has a first exposed surface facing the exposed surface of the tank part, the plurality of blades protrude from the first exposed surface, each of the plurality of blades has a second exposed surface facing the exposed surface of the tank part, and the second exposed surfaces and the first exposed surface provide different visual effects;
wherein a color of the first exposed surfaces is different from a color of the second exposed surfaces;
wherein in said each of the impellers, the first exposed surface and the second exposed surface are in contrast colors; and
wherein the exposed surfaces of the tank parts slant towards each other in a direction away from the base.

2. The liquid-cooling heat dissipation device according to claim 1, wherein the exposed surfaces of the tank parts are not parallel to each other.

3. The liquid-cooling heat dissipation device according to claim 2, wherein the base has a thermal contact surface located on a bottom part of the base, the exposed surfaces of the tank parts face away from the thermal contact surface and an angle between normal lines of the exposed surfaces of the tank parts is obtuse.

4. The liquid-cooling heat dissipation device according to claim 3, wherein the exposed surfaces of the tank parts slant away from the thermal contact surface.

5. The liquid-cooling heat dissipation device according to claim 1, wherein the base has a thermal contact surface located on a bottom part of the base, the exposed surfaces of the tank parts are parallel to each other and both are perpendicular to the thermal contact surface.

6. The liquid-cooling heat dissipation device according to claim 1, wherein an axis of the impeller in one of the two pumps and an axis of the impeller in another one of the two pumps are not parallel to each other.

7. The liquid-cooling heat dissipation device according to claim 6, wherein an angle between the axis of the impeller in one of the two pumps and the axis of the impeller in another one of the two pumps is obtuse.

8. The liquid-cooling heat dissipation device according to claim 1, wherein the base has a heat dissipation space, each of the two tank parts has a chamber, a second inlet and a second outlet, and the second inlet and the second outlet are connected to the chamber, the two second inlets are connected to the first inlet, and the two second outlets and the first outlet are connected to the heat dissipation space.

9. The liquid-cooling heat dissipation device according to claim 1, wherein the base comprises a body part and a thermally conductive part, the thermally conductive part is disposed on a bottom part of the body part, the thermally conductive part and the body part together form the heat dissipation space, the thermally conductive part has a thermal contact surface located away from the body part, and the thermal contact surface is configured to be in thermal contact with a heat source.

10. The liquid-cooling heat dissipation device according to claim 1, further comprising a pipe, wherein the pipe comprises two branch parts and a convergence part, respective ends of the two branch parts are connected to an end of the convergence part, the two second outlets are respectively connected to the two branch parts of the pipe, and the convergence part of the pipe is connected to the heat dissipation space of the base.

11. The liquid-cooling heat dissipation device according to claim 10, wherein an angle between the two branch parts is obtuse.

12. A liquid cooling heat dissipation device, comprising:
a base, having a first inlet and a first outlet;

two tank parts, disposed on the base, both of the two tank parts connected to the first inlet and the first outlet so that the two tank parts are in a parallel arrangement; and two impellers, respectively disposed in the two tank parts;

wherein, each of the two tank parts has an exposed surface, the exposed surfaces of the two tank parts are light-permeable, and the two impellers are respectively exposed via the exposed surfaces of the two tank parts;

wherein said each of the impellers comprises a hub and a plurality of blades, in said each of the impellers, the hub has a first exposed surface facing the exposed surface of the tank part, the plurality of blades protrude from the first exposed surface, each of the plurality of blades has a second exposed surface facing the exposed surface of the tank part, and the second exposed surfaces and the first exposed surface provide different visual effects;

wherein a color of the first exposed surfaces is different from a color of the second exposed surfaces;

wherein in said each of the impellers, the first exposed surface and the second exposed surface are in contrast colors; and wherein the exposed surfaces of the tank parts slant towards each other in a direction away from the base.

13. The liquid-cooling heat dissipation device according to claim 12, wherein the base has a heat dissipation space, each of the two tank parts has a chamber, a second inlet and a second outlet, and the second inlet and the second outlet are connected to the chamber, the two second inlets are connected to the first inlet, and the two second outlets and the first outlet are connected to the heat dissipation space.

14. The liquid-cooling heat dissipation device according to claim 12, further comprising a pipe, wherein the pipe comprises two branch parts and a convergence part, respective ends of the two branch parts are connected to an end of the convergence part, the two second outlets are respectively connected to the two branch parts of the pipe, and the convergence part of the pipe is connected to the heat dissipation space of the base.

15. The liquid-cooling heat dissipation device according to claim 14, wherein an angle between the two branch parts is obtuse.

16. The liquid-cooling heat dissipation device according to claim 12, wherein the base has a thermal contact surface located on a bottom part of the base, the exposed surfaces of the tank parts face away from the thermal contact surface, and an angle between normal lines of the exposed surfaces of the tank parts is obtuse.

17. The liquid-cooling heat dissipation device according to claim 16, wherein the exposed surfaces of the tank parts slant away from the thermal contact surface.

18. The liquid-cooling heat dissipation device according to claim 12, wherein the base has a thermal contact surface located on a bottom part of the base, the exposed surfaces of the tank parts are parallel to each other and both are perpendicular to the thermal contact surface.

19. The liquid-cooling heat dissipation device according to claim 12, wherein an axis of the impeller in one of the two pumps and an axis of the impeller in another one of the two pumps are not parallel to each other.

20. The liquid-cooling heat dissipation device according to claim 12, wherein an angle between an axis of the impeller in one of the two pumps and an axis of the impeller in another one of the two pumps is obtuse.

* * * * *